(12) United States Patent
Harrand

(10) Patent No.: US 9,543,012 B2
(45) Date of Patent: Jan. 10, 2017

(54) SYSTEM FOR WRITING DATA IN A MEMORY

(71) Applicant: Commissariat à l'Énergie Atomique et aux Énergies Alternatives, Paris (FR)

(72) Inventor: Michel Harrand, Saint Egreve (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/103,274

(22) PCT Filed: Dec. 12, 2014

(86) PCT No.: PCT/EP2014/077651
§ 371 (c)(1),
(2) Date: Jun. 9, 2016

(87) PCT Pub. No.: WO2015/086845
PCT Pub. Date: Jun. 18, 2015

(65) Prior Publication Data
US 2016/0314837 A1    Oct. 27, 2016

(30) Foreign Application Priority Data

Dec. 12, 2013 (FR) ...................... 13 62469

(51) Int. Cl.
*G11C 8/12*       (2006.01)
*G11C 13/00*    (2006.01)
(Continued)

(52) U.S. Cl.
CPC ....... *G11C 13/0069* (2013.01); *G06F 11/1068* (2013.01); *G11C 11/418* (2013.01);
(Continued)

(58) Field of Classification Search
CPC ......... G11C 8/12; G11C 7/1021; G11C 16/10; G11C 7/1006; G11C 8/10
(Continued)

(56) References Cited

U.S. PATENT DOCUMENTS

2006/0062041 A1* 3/2006 Hiraka .................... G06F 3/061
                                                                                    365/145
2010/0080071 A1    4/2010 Huang et al.
(Continued)

OTHER PUBLICATIONS

International Search Report, dated Mar. 9, 2015, from corresponding International Application No. PCT/EP2014/077651.
(Continued)

*Primary Examiner* — Jason Lappas
(74) *Attorney, Agent, or Firm* — Wolf, Greenfield & Sacks, P.C.

(57) ABSTRACT

A system including: a first memory including several portions of one or more pages each, said memory including first and second ports that can simultaneously access, for reading and writing respectively, two distinct pages of portions of the memory; and a control circuit capable of performing write operations to the pages of the memory, each write operation to a page of the memory requiring a reading step of a former datum on said page via the first port, and including a writing step of a new datum to the page via the second port, taking account of the former datum.

8 Claims, 2 Drawing Sheets

(51) Int. Cl.

| | | |
|---|---|---|
| *G11C 11/418* | (2006.01) | |
| *G11C 11/419* | (2006.01) | |
| *G11C 14/00* | (2006.01) | |
| *G06F 11/10* | (2006.01) | |
| *G11C 29/52* | (2006.01) | |
| *G11C 8/10* | (2006.01) | |
| *G11C 7/10* | (2006.01) | |
| *G11C 16/10* | (2006.01) | |

(52) U.S. Cl.
CPC .......... *G11C 11/419* (2013.01); *G11C 13/004* (2013.01); *G11C 13/0023* (2013.01); *G11C 13/0064* (2013.01); *G11C 14/009* (2013.01); *G11C 29/52* (2013.01); *G11C 7/1021* (2013.01); *G11C 8/10* (2013.01); *G11C 8/12* (2013.01); *G11C 16/10* (2013.01)

(58) Field of Classification Search
USPC ....... 365/238.5, 189.16, 185.22, 145, 189.05
See application file for complete search history.

(56) References Cited

U.S. PATENT DOCUMENTS

| | | |
|---|---|---|
| 2010/0103723 A1 | 4/2010 | Kawai et al. |
| 2011/0085398 A1 | 4/2011 | Roy |
| 2011/0185259 A1 | 7/2011 | Seo et al. |

OTHER PUBLICATIONS

Zhou et al.: "A Durable and Energy Efficient Main Memory Using Phase Change Memory Technology," (2009) ISCA June 204-24.
Lee et al.: "Architecting Phase Change Memory as a Scalable DRAM Alternative," (2009) ISCA June 204-24; pp. 1-12.
Ipek et al.: Dynamically Replicated Memory: Building reliable Systems from Nanoscale Resistive Memories,: (2010) ASPLOS Mar. 13-17.
Schecter et al.: "Use ECP, not ECC, for Hard Failures in Resistive Memories," (2010) ISCA Jun. 19-23.
Chiu et al.: "Low Store Energy, Low VDDmin, 8T2R Nonvolatile Latch and SRAM With Vertical-Stacked Resistive Memory (Memristor) Devices for Low Power Mobile Applications," (2012) IEE Journal of Solid State Circuits vol. 47 (6); pp. 1483-1489.
Seong et al.: "Security Refresh: Prevent Malicious Wear-Out and Increase Durability for Phase-Change Memory with Dynamically Randomized Address Mapping," (2010) ISCA Jun. 19-23; pp. 383-394.
Qureshi et al.: "Enhancing Lifetime and Security of PCM-Based Main Memory with Start-Gap Wear Leveling," (2009) MICRO, Dec. 12-16; pp. 14-23.
Written Opinion, dated Mar. 9, 2015, from corresponding International Application No. PCT/EP2014/077651.

* cited by examiner

SYSTEM FOR WRITING DATA IN A MEMORY

CROSS-REFERENCE TO RELATED APPLICATIONS

This application is the national phase of International Application No. PCT/EP2014/077651, filed on Dec. 12, 2014, which claims priority to French patent application 13/62469, filed on Dec. 12, 2013, both of which applications are hereby incorporated by reference to the maximum extent allowable by law.

BACKGROUND

The present application relates to the field of electronic memories.

DISCUSSION OF THE RELATED ART

In the present application, term memory, memory device, or electronic memory designates a device comprising a plurality of elementary storage cells, each cell being programmable to store one or a plurality of data bits. In practice, a memory may contain a very large number of elementary cells, typically from several millions to several hundred billions.

So-called resistive memories, that is, memories where each elementary storage cell comprises an element having a resistance which can be modified by being applied a bias voltage, are in particular considered. Among the most common resistive memories, one may especially mention:

phase change memories, generally called PCM in the art, where the resistive element is formed by means of a material having a crystalline state, and accordingly a resistivity, capable of being changed, by varying its temperature during the write operation;

conductive bridge random access memories, generally designated with acronym CBRAM in the art, where the resistive element is formed by means of an insulating material where a conductive filament may be created or suppressed by application of a bias voltage; and oxide-based resistive random access memories, generally designated with acronym OxRRAM in the art, where the resistive element is also formed by means of an insulating material where a conductive filament may be created or suppressed by application of a bias voltage.

A disadvantage of resistive memories is that they have a relatively short lifetime or endurance. As an illustrative example, the number of write operations that an elementary cell of a resistive memory can typically withstand is in the order of $10^8$, while this number is almost infinite, for example, in the order of $10^{16}$, for a cell of a DRAM-type volatile capacitive memory.

Another disadvantage of resistive memories is the fact that the writing of a bit into a memory cell requires a relatively high quantity of energy.

To increase the lifetime of a PCM-type memory and decrease the electric power consumption thereof, it has been provided, in the article entitled "A Durable and Energy Efficient Main Memory Using Phase Change Memory Technology" of Ping Zhou et al., for each new data write operation into the memory, to start by reading the data contained in the memory area which is desired to be written into, and then to write into the memory only the bits of the new data having their value differing from the bits of the old data. The memory wear and the electric power consumed during a reading step being relatively low as compared with the memory wear and the electric power consumed during a write operation, this enables to increase the memory lifetime and to decrease the electric consumption thereof while avoiding redundant write operations.

However, a disadvantage of this solution is that the reading step which comes before each writing step during a write operation in the memory causes a non-negligible increase in memory write times.

SUMMARY

Thus, an embodiment provides a system comprising: a first memory comprising a plurality of portions of a plurality of pages each, the memory comprising first and second ports providing simultaneous access, respectively in read and in write mode, to two memory pages, provided for the pages to belong to different portions of the memory, each portion of the first memory comprising a single port of access to the pages in the portion, this port being capable of being connected to one or the other of the first and second ports of the first memory by multiplexing circuits; a second memory comprising a number of lines equal to the number of pages of a portion of the first memory, each line of the second memory containing a first field capable of containing an address of a portion of the first memory, a second field capable of containing the content of a page of the first memory, a third field capable of containing the content of a page of the first memory, and a fourth field capable of containing a validity bit; and a control circuit capable of performing write operations in pages of the memory, each write operation in a page of the memory comprising a step of reading old data from this page via the first port, followed by a step of writing new data into this page via the second portion while taking into account the old data, wherein the control circuit is capable, for each read or write operation in a page of the first memory, of consulting the fourth field of the line having its address in the second memory corresponding to the address of the targeted page in the portion to which it belongs.

According to an embodiment, the control circuit is further capable, for each read or write operation in a page of the first memory, of: determining whether the fourth field of the address line corresponding to the address of the targeted page is in a valid state; and/or comparing the content of the first field of said line with the address of the portion containing the targeted page.

According to an embodiment, the first memory is a resistive memory.

According to an embodiment, to carry out first and second consecutive write operations in first and second pages of different portions of the first memory, the control circuit is capable of, successively: reading first old data from the first page via the first port and writing these data into the second memory; reading second old data from the second page via the first port and writing these data into the second memory and, simultaneously, writing first new data into the first page via the second port while taking into account the first old data; and writing second new data into the second page via the second port while taking into account the second old data.

According to an embodiment, the second memory is a SRAM.

According to an embodiment, each page of the first memory comprises a plurality of elementary data storage cells, and the control circuit is capable, for each operation of writing new data into a page of the first memory, during the writing step of this write operation, of comparing the old data read from the page with the new data, and of only writing into the cells of the page having a content to be modified in order to record the new data.

According to an embodiment, each page of the first memory comprises at least first and second words, each comprising one or a plurality of elementary data storage cells, and an assembly of one or a plurality of elementary data storage cells capable of containing an error correction code protecting data contained in the first and second words.

According to an embodiment, the control circuit is capable, for each operation of writing into a page of the memory, of reading from the page old data comprising the contents of the first and second words of the page and the error correction code protecting them, of correcting if necessary the contents of the first and second words by means of the error correction code, of replacing in the old data the content of at least one of the first and second words with the new user data, of recalculating the error correction code to take into account the new user data, and then of writing into the page the new data and the new error correction code.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
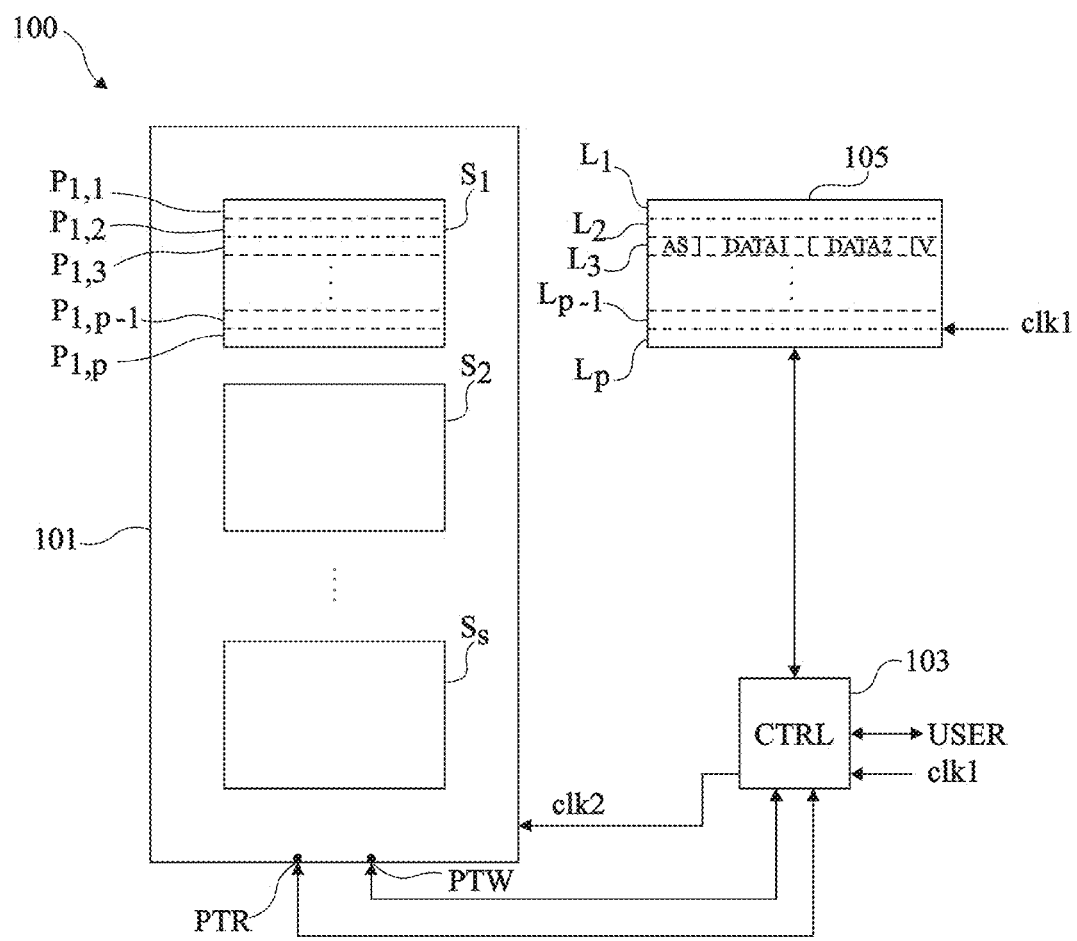
FIG. 1 schematically and partially shows an embodiment of a system comprising a memory and means enabling to perform memory write operations.

For clarity, the same elements have been designated with the same reference numerals in the different drawings. Further, only those elements which are useful to the understanding of the described embodiments have been shown and will be detailed hereafter.

FIG. 1 schematically and partially shows an embodiment of a system 100 comprising a memory 101, for example, a resistive memory, and means enabling to perform operations of writing into memory 101.

Memory 101 comprises a plurality of elementary cells (not shown) distributed into a plurality of portions or segments Si, i being an integer in the range from 1 to s and s being an integer greater than 1. The elementary cells of each portion Si are distributed into one or a plurality of pages $P_{i,j}$, j being an integer in the range from 1 to p and p being an integer greater than or equal to 1, of a plurality of cells each. In this example, a page corresponds to the largest quantity of memory addressable in read or in write mode within a single memory cycle, that is, the largest group of elementary cells which may be read from or written into within a single cycle in the memory.

As a non-limiting illustration, memory 101 is a 1-gigabit memory, organized in 512 segments, each segment comprising 4,096 pages of 64 bytes each.

According to an aspect of the embodiment of FIG. 1, memory 101 has an architecture enabling to access at the same time in read mode a first memory page and in write mode a second memory page, provided for the first and second pages to belong to different portions Si of the memory. In this example, memory 101 comprises a first access port PTR enabling to access the memory pages in read mode, and a second access port PTW enabling to access the memory pages in write mode, ports PTR and PTW enabling to simultaneously address, that is, within a same memory cycle, two pages Si of different portions of the memory. At each operating cycle of memory 101, it is thus possible to read from a page of a portion of memory 101 via port PTR, and to write into a page of another portion of memory 101 via port PTW.

System 100 further comprises a control circuit 103 (CTRL) for example comprising a specific microcontroller or circuit, for example using a finite state machine. Circuit 103 is capable of receiving memory access requests originating from a user (USER) of the memory, and of answering these requests, by accessing for this purpose pages $P_{i,j}$ of the memory via its access ports PTR and PTW. Circuit 103 is particularly capable of performing write operations in memory pages, each write operation in a page $P_{i,j}$ of the memory comprising a step of reading old data contained in page $P_{i,j}$ via port PTR, followed by a step of writing new data into page $P_{i,j}$ via port PTW while taking into account the old data.

As an example, during a write operation in a page $P_{i,j}$, circuit 103 starts by reading the old data contained in page $P_{i,j}$, compares the old data with the new data provided by the user, and then writes into page $P_{i,j}$ only the bits of the new data which differ from the bits of the old data. To achieve this, as a non-limiting example, a bit-to-bit XOR may be performed between the old data and the new data. For each bit of the address page, if the result of the XOR is a 1, this means that the value which is desired to be written is different from the value already contained at the same position in the page. In this case, the write amplifier of the corresponding cell is controlled to write the new value into the cell. If, conversely, the result of the XOR is a 0, this means that the value which is desired to be written is identical to the value already contained at the same position in the page. In this case, the write amplifier of the corresponding cell is blocked or deactivated, and the write operation is not carried out. In practice, the new data provided by the user may be applied to a data input of the memory, and the result of the XOR between the old data and the new data may be applied at the same time on a control input of the write amplifiers of the memory. This enables to suppress write operations into redundant cells and thus to increase the lifetime of the memory and/or to decrease the electric power consumption thereof, in particular if the memory is a memory which wears more when it is written into than when it is read from, and/or if the memory consumes more power when it is written into than when it is read from.

An advantage of system 100 of FIG. 1 results from the fact that the reading and writing steps of a same write operation are performed via different memory ports PTR and PTW. This enables, from the user's viewpoint, to decrease the times of access to the memory data as compared with existing systems. Indeed, when a write operation required by the user is carried out by control circuit 103, circuit 103 may:

during a first memory cycle, carry out the reading step of the write operation via port PTR and perform, via port PTW, a writing step of another operation, for example, a writing step of a previous write operation; and during a second memory cycle, carry out the writing step of the write operation via port PTW and perform, via port PTR, a reading step of another operation, for example, a reading step of a next write operation. Thus, although a write operation is performed in two memory cycles, system 100 of FIG. 1 enables, from the user's viewpoint, to process one write operation per memory cycle, the duration of the memory cycle being conditioned by the longest of the memory read and write times.

In the example of FIG. 1, to manage the consecutive user accesses to a same portion Si of memory 101, system 100 comprises, in addition to memory 101, a buffer memory 105 from and into which control circuit 103 can read and write. Memory 105 is capable of storing a table of p lines Lj, j being an integer in the range from 1 to p and p being an integer greater than or equal to 1, that is, a table comprising a number of lines Lj equal to the number of pages Pi,j in each segment Si of memory 101. In this example, each line Lj of buffer memory 105 comprises a first subset of bits or fields AS capable of containing an address of a segment of memory 101, a second subset of bits or field DATA1, for example, of the size of a page Pi,j of memory 101, capable of containing first data read or to be written into a page of memory 101, a third subset of bits or field DATA2, for example, of the size of a page Pi,j of memory 101, capable of containing second data read or to be written into a page of memory 101, and a bit or validity field V indicating whether fields AS, DATA1, and DATA2 of line P'j contain or not valid values.

Memory 105 may be a memory of different technology than memory 101, for example, a memory having shorter read or write access times than memory 101, for example, a SRAM.

As an example, memory 105 and control circuit 103 on the one hand, and memory 101 on the other hand, may be rated by clocks of different frequencies. In the shown example, memory 105 and control circuit 103 receive a first clock signal clk1 of a first frequency, and memory 101 receives a second clock signal clk2 of frequency lower than first signal clk1, signal clk2 being generated by control circuit 103 by frequency division of signal clk1. As a variation, fast clock signal clk1 may be generated by frequency multiplication of the slow clock signal clk2 used to rate memory 101, for example, by means of a phase-locked loop.

A (non-limiting) example of operation of system 100 of FIG. 1 will now be described.

On initialization of system 100, all validity fields V of buffer memory 105 are set to an invalid state.

When a write operation in a page Pi,j of memory 101 is required by the user, control circuit 103 consults the table of lines Lj of buffer memory 105, at the address corresponding to the page address of the user request, that is, it consults the line Lj of same rank j in the table of memory 105 as page Pi,j in segment Si. As a variation, the line addresses and the page addresses are not identical, but there exists in any case a bijective transformation between line addresses and page addresses, that is, each line address is associated with one and the same page address, and conversely.

If validity field V of line Lj is in a valid state, control circuit 103 verifies whether the segment address field AS of line Lj contains the same segment address as the user request.

If validity field V of line Lj is in a valid state and if field AS of line Lj contains a segment address different from that of the user request, control circuit 103 determines, by taking into account the data contained in fields DATA1 (old data) and DATA2 (new data) of line Lj, the data to be written into page Pi',j of memory 101 having its address defined by the segment address contained in field AS of data Lj and by the page address of the user request, and then writes these data into page Pi',j via port PTW (i' being the rank of the segment having its address contained in field AS of line Lj).

In the case where system 100 implements the above-mentioned wear decrease mechanism, the data written into page Pi',j are the data contained in field DATA2 with no modification, but only the bits of these data which differ from the data contained in field DATA1 are effectively written. To achieve this, the control signal to be applied to the write amplifiers of memory 101 is calculated by executing a bit-to-bit XOR between the data contained in fields DATA1 and DATA2. The result of the XOR is sent to memory 101 at the same time as data DATA2.

In parallel to this reading step, control circuit 103 reads the data contained in page Pi,j of memory 101, writes these data into field DATA1 of line Lj, writes the new user data (contained in the user request) into field DATA2 of line Lj, and writes the segment address of the user request into field AS of line Lj.

If the validity field V of line Lj is in a valid state and if field AS of line Lj contains the same segment address as the user request, control circuit 103 directly writes into field DATA2 of line Lj the new user data to be written into page Pi,j. In this case, the processing of the write operation comprises no step of reading old data from page Pi,j of memory 101, the old data being already contained in field DATA1 of line Lj.

If validity field V of line Lj is in an invalid state, control circuit 103 reads the data contained in page Pi,j of memory 101, writes these data into field DATA1 of line Lj, writes the new user data into field DATA2 of line Lj, writes the segment address of the user request into field AS of line Lj, and sets validity field V of the data of line Lj to the valid state.

It should be noted that in this example, the step of determining the data to be written into a page Pi,j of the memory, taking into account the old data contained in this page and the new data provided by the user, is carried out just before the step of writing the new data into page Pi,j. As a variation, this step may be carried out further upstream, just after the reading of the old data contained in page Pi,j. In particular, in the above-mentioned example of operation, one may, instead of writing the new user data into field DATA2 of line Lj (after having read the old data contained in page Pi,j), combine the old data and the new data and directly write the result of this combination into field DATA2 of line Lj, or write the new data and the result of the combination (for example, the result of the XOR between the old and the new data) into field DATA2 in the case where the above-mentioned wear decrease mechanism is implemented.

It should be noted that in this case, in each line Lj of buffer memory 105, field DATA2 may have the size of two pages Pi,j of memory 101, to be able to contain both new user data to be written into a page of the memory, and the result of the combination between the new data and old data, for example, the result of the XOR between the new data and old data.

Such an alternative embodiment is particularly advantageous when the steps of writing into memory 101 are longer than the steps of reading from memory 101.

When a read operation in a page Pi,j of memory 101 is required by the user, control circuit 103 consults the table of lines Lj of buffer memory 105, at the page address of the user request, that is, it consults the line Lj of same rank j in the table of memory 105 as page Pi,j in segment Si.

If the validity field V of line Lj is in a valid state, and if the segment address field AS of line Lj contains the same segment address as the user request, this means that the data targeted by the user are located in line Lj of the buffer memory. Control circuit 103 then determines, while taking into account, if present, data contained in fields DATA1 and DATA2 of line Lj, the data to be returned to the user and transmits these data to the user. In the above-mentioned example of application to a memory wear and/or power consumption decrease mechanism, the data returned to the user by circuit 103 may directly be the data contained in field DATA2 of line Lj.

If the validity field V of line Lj is in a valid state, and if the segment address field AS of line Lj does not contain the same segment address as the user request, or if the validity field V of line Lj is in an invalid state, control circuit 103 reads the targeted data directly from memory 101 and does not write into buffer memory 105.

As a variation, one may also, for each read operation, store the read data in buffer memory 105 so that it can be subsequently read once again faster and with a lower power consumption in the case where pages of the memory are, statistically, bound to be read from more often than they are written into.

To achieve this, a second bit or validity field V' (not shown) is introduced into each line Lj of buffer memory 105, which is initially in an invalid state and which is set to a valid state when new data to be written originating from a user request are written into field DATA2 of line Lj.

When an operation of reading from a page Pi,j of memory 101 is required by the user, control circuit 103 consults the table of lines Lj of buffer memory 105, at the page address of the user request.

If the validity field V of line Lj is in a valid state, and if the segment address field AS of line Lj contains the same segment address as the user request, control circuit 103 verifies whether validity field V' of line Lj is in the valid state.

If field V' of line Lj is in the valid state, control circuit 103 proceeds as previously, that is, it determines, taking into account the data contained in fields DATA1 and DATA2 of line Lj, the data to be returned to the user and provides these data to the user.

If field V' of line Lj is in the invalid state, control circuit 103 directly provides to the user the data contained in field DATA1 of line Lj, without taking into account the data contained in field DATA2 of line Lj.

If the validity field V of line Lj is in a valid state, and if the segment address field AS of line Lj contains a segment address different from the segment address of the user request, control circuit 103 verifies whether validity field V' of line Lj is in the valid state.

If field V' of line Lj is in the valid state, this means that a step of writing into memory 101 is awaiting. Control circuit 103 then determines, taking into account the data contained in fields DATA1 and DATA2 of line Lj, the data to be written into page Pi',j of memory 101 having their address defined by the segment address contained in field AS of line Lj and by the page address of the user request, and then writes these data into page Pi',j via port PTW. In parallel with this writing step, control circuit 103 reads the data contained in page Pi,j of memory 101, writes these data into field DATA1 of line Lj, provides these data to the user, and sets field V' of line Lj to the invalid state.

If field V' of line Lj is in the invalid state, control circuit 103 reads the data contained in page Pi,j of memory 101, writes these data into field DATA1 of line Lj, provides these data to the user, and leaves field V' of line Lj in the invalid state.

If field V of line Lj is in the invalid state, control circuit 103 reads the data contained in page Pi,j of memory 101, writes these data into field DATA1 of line Lj, provides these data to the user, and sets field V of line Lj to the valid state and field V' of line Lj to the invalid state.

When an operation of writing into a page Pi,j of memory 101 is required by the user, control circuit 103 carries out the operations described in the previous example and further sets bit V' of line Lj to the valid state.

In the case where buffer memory 105 is a volatile memory and where main memory 101 is a non-volatile memory, mechanisms may be provided to avoid, on powering-off of the system, a possible loss of data which would be recorded in buffer memory 105 but not written yet in main memory 101.

As an example, before a power cut-off, the user system may send a stop instruction to control circuit 103. Control circuit 103 may then browse all the lines of buffer memory 105 and carry out the write operations into memory 101 which have not be performed yet. In this case, all the validity fields V or V and V' of the buffer memory may be initialized to the invalid state on each powering-on of the system.

As a variation, buffer memory 105 may be coupled to an additional non-volatile memory, not shown, having all the data contained in buffer memory 105 transferred into it before the system is powered off. Such an additional non-volatile memory may be included or not in main memory 101. When the system is powered back on, the data of the additional non-volatile memory may be transferred back into buffer memory 105. As an example, each storage cell of buffer memory 105 may be coupled to a non-volatile storage element, so that the content of memory 105 may be integrally transferred into the non-volatile storage elements in a single cycle before powering off the system.

Validity fields V or V and V' of buffer memory 105 are then for example set of the invalid state only at the first system powering on.

It should be noted that the described embodiments are not limited to the above-mentioned specific example of use of the system of FIG. 1 for the implementation of a mechanisms for decreasing the wear and/or the power consumption of memory 101, where each operation of writing new data into memory 101 comprises a step of reading old data from the memory, followed by a step of writing at the same address only into the memory cells having a state which must be modified in order to record the new data.

More generally, system 100 of FIG. 1 is compatible with any application where an operation of writing new data into a memory, be it resistive or of another type, for example, a capacitive memory, comprises a step of reading old data from the memory, followed by a step of writing the new data, at the same memory address, while taking into account the old data.

As an example of application, the case where, in each page Pi,j of memory 101, elementary cells of the page are distributed into a plurality of words Mi,j,k (k being an integer in the range from 1 to m and m being an integer greater than 1) of a plurality of cells each, for example, 32-bit words, and other elementary cells of the memory are assigned to the storage of error correction codes, for example, Hamming codes, enabling to protect the data contained in words of the page against a possible failure of a cell from the page, for example, due to alpha particles, is considered. In this example, a same error correction code is assigned to the protection of a plurality of words in the page (two or more). After, for simplification, the case where each page Pi,j contains a single error correction code protecting all the words in the page is considered. It will however be within the abilities of those skilled in the art to adapt the described operation to the case where a page contains a plurality of different groups of at least two words each, and one error correction code per group.

When, during an operation of writing new data into a page, the user wishes to only modify part of the words in the page, for example, a single word in the page, it may be envisaged to write the new user data into this word of the page in a single writing step, by deactivating the write amplifiers of the other cells in the page to avoid affecting their content. However, such a solution does not enable to update the error code of the page to take into account the new written data.

Thus, during a write operation, it may be provided to read the old content of the page, to correct, possibly this content by means of the error correction code of the page, to modify this content by inserting into it the new user data and by modifying the correction code to take into account the new user data, and then to write the new content into the page.

Each operation of writing new data into a page thus comprises a step of reading old data from the page, followed by a step of writing the new data into the page, taking into account the old data.

It should thus be understood that the use of system 100 of FIG. 1 to carry out such write operations advantageously enables, from the user's viewpoint, to decrease the times of access to the data contained in the memory.

Figure 2:
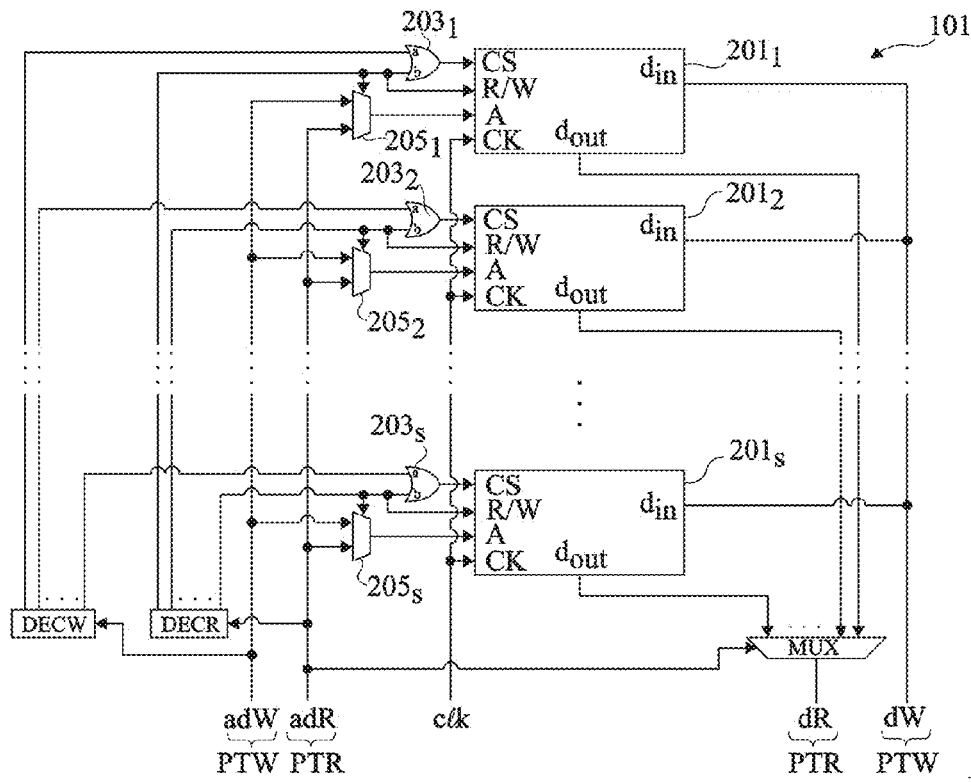
FIG. 2 shows in further detail an embodiment of the memory of the system of FIG. 1.

FIG. 2 schematically and partially shows an embodiment of a memory 101 compatible with the system of FIG. 1. In this example, memory 101 comprises a plurality of memory portions 201$i$, i being an integer in the range from 1 to s and s being an integer greater than 1, of a plurality of pages (not shown in FIG. 2) each. In this example, each portion 201$i$ of memory 101 corresponds to a segment Si of the memory.

Memory 110 comprises a first access portion PTR enabling to access in read mode the pages of memory 101 and a second access port PTW enabling to access in write mode the pages of memory 101, ports PTR and PTW enabling to simultaneously access any two pages of memory 101, provided for these pages to belong to different memory portions 201$i$.

Access port here means an assembly of input and/or output terminals capable of receiving an address signal, of receiving an input data signal, and/or of supplying an output data signal. An access port may in particular comprise an address input over a plurality of bits, capable of receiving an address signal, a data input over a plurality of bits, capable of receiving a data signal to be written into the memory, and/or a data output over a plurality of bits, capable of delivering a data signal read from the memory. The data input and the data output may be confounded. In the example of FIG. 2, access port PTR of memory 101 comprises an address input adR capable of receiving an address of a page to be read from the memory, and a data output dR capable of transmitting the content of a page read from the memory, and access portion PTW comprises an address input adW capable of receiving an address of a page to be written into the memory, and a data input dW capable of receiving a content to be written into a page of the memory. In the case where a wear reduction mechanism of the above-mentioned type is implemented, write access port PTW may further comprise an input cmdW (not shown) for controlling the memory read amplifiers, for example, of the same size as data input dW, such a control input being capable of receiving data for controlling the write amplifiers, for example, the result of the XOR between new user data to be written into the memory via input dW and old data read at the same memory address.

In this example, each memory portion 201$i$ comprises an input CS capable of receiving a signal of activation/deactivation of portion 201$i$, an input R/W capable of receiving a read or write control signal of portion 201$i$, an input CK capable of receiving a clock signal, an input A capable of receiving an address of a page of memory portion 201$i$, an input din capable of receiving data (of the size of a page) to be written into address page A of memory portion 201$i$, and an output dout capable of providing data (of the size of a page) read from address page A of memory portion 201$i$.

In this example, each portion 201$i$ of memory 101 has its activation input CS connected to the output of an OR gate 203$i$ with two inputs a and b, its operating mode control input R/W connected to input b of OR gate 203$i$, and its data input din connected to data input dW of access port PTW. In the case where a wear reduction mechanism of the above-mentioned type is implemented, each portion 201$i$ of the memory may further comprise an input cmdin (for controlling its write amplifiers, connected to control input cmdW (not shown) of port PTW.

Memory 101 comprises a read address decoding circuit DECR, comprising an input connected to address input adR of access port PTR of the memory and s binary outputs respectively connected to inputs a of OR gates 2031 to 203$s$. Memory 101 further comprises a write address decoding circuit DECW, comprising an input connected to address input adW of access port PTW of the memory and s binary outputs respectively connected to inputs b of OR gates 2031 to 203$s$. Decoder DECR is capable of determining the portion 201$i$ of memory 101 where the word addressed by address input adR is located, and of applying an activation signal on input a of OR gate 203$i$ connected to this memory portion. Decoder DECW is capable of determining the portion 201$i$ of memory 101 where the word addressed by address input adW is located, and of applying an activation signal on input b of OR gate 203$i$ connected to this memory portion. Thus, decoders DECR and DECW may simultaneously activate two different memory portions 201$i$. In practice, among the address bits applied to inputs adR and adW, one may only transmit to decoders DECR and DECW the bits indicating the numbers of the memory portions where the addressed pages are located.

In this example, each portion 201$i$ of memory 101 has its addressing input A connected to the output of a two-input-to-one-output multiplexer 205$i$. Each multiplexer 205$i$ has a first input connected to address input adR of port PTR and a second input connected to address input adW of port PTW. In this example, each multiplexer 205$i$ further has a selection input connected to input b of OR gate 203$i$ connected to memory portion 201$i$. The operation of multiplexers 205$i$ is such that: when a memory portion 201$i$ is activated by decoder DECR, the address provided by multiplexer 205$i$ on input A of memory portion 201$i$ is that transmitted by address input adR; and when a memory portion 201$i$ is activated by decoder DECW, the address provided by multiplexer 205$i$ on input A of memory portion 201$i$ is that transmitted by address input adW. In practice, among the address bits transmitted by address inputs adR and adW, it is possible to only transmit to multiplexers 205$i$ the bits defining the position of the addressed page inside of memory portion 201$i$ where it is located.

In this example, memory 101 further comprises a s-input-to-one-output multiplexer MUX, having its output connected to data output dR of port PTR. The s inputs of multiplexer MUX are respectively connected to the s data outputs dout of the s portions 201i of memory 101. In this example, multiplexer MUX has a control or selection input connected to address input adR of access port PTR of the memory. The operation of multiplexer MUX is such that, when a memory portion 201i is activated by decoder DECR, the data provided by multiplexer MUX on data output dR are those provided by memory portion 201i on its output dout. In practice, among the address bits applied to address input adR, it is possible to only transmit to multiplexer MUX the bits indicating the numbers of the memory portions where the addressed pages are located.

In this example, inputs CK of the different portions 201i of memory 101 are connected to a same node clk of application of a clock signal. As an example, the different portions 201i of memory 101, and elements 203i, 205i, 407j, DECR, DECW, and MUX may be integrated in a same semiconductor chip.

An advantage of memory 101 is that it allows simultaneous accesses in read mode and in write mode to different memory words, while having a bulk scarcely larger than that of a single-port memory.

Figure 3:
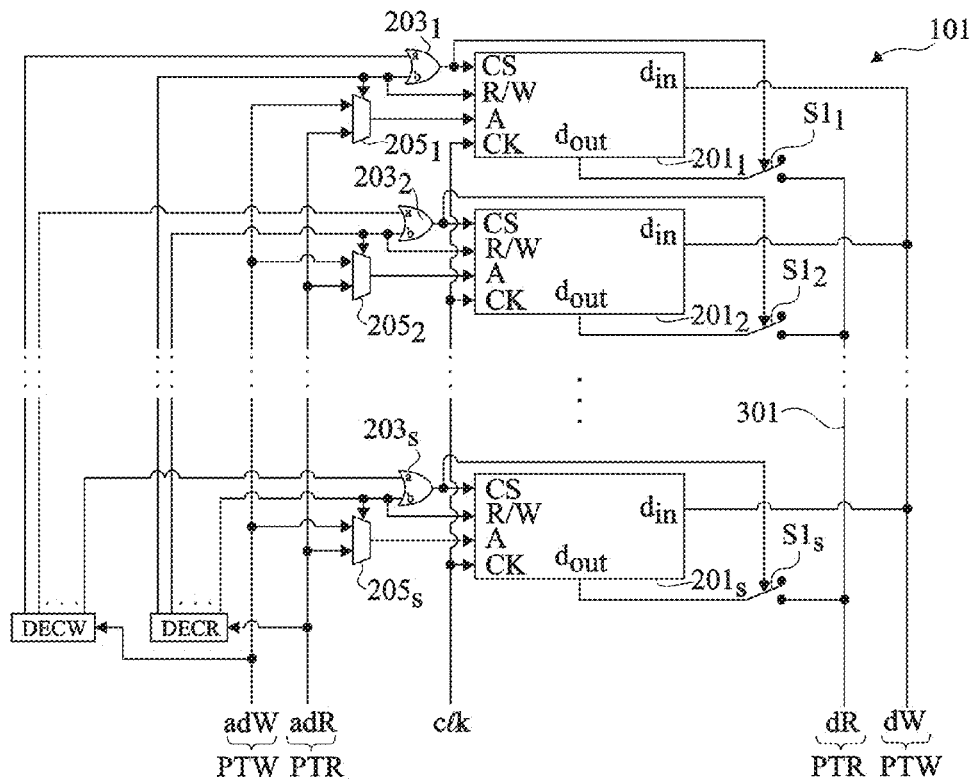
FIG. 3 shows another embodiment of the memory of the system of FIG. 1.

FIG. 3 schematically and partially shows another embodiment of a memory 101 compatible with the system of FIG. 1. Memory 101 of FIG. 3 comprises many elements in common with memory 101 of FIG. 2. These elements will not be described again herein. Hereafter, only the differences between the memories of FIGS. 2 and 3 will be highlighted.

Memory 101 of FIG. 3 comprises, as in the example of FIG. 2, a first read access portion PTR comprising an input adR for an address a page to be read from, and an output dR for data read from a page, and a second access port PTW comprising an input adW for an address of a page to be written into, an input dW for data to be written into a page and, possibly, an input cmdW (not shown) for controlling the memory write amplifiers.

Further, memory 101 of FIG. 3 comprises, as in the example of FIG. 2, a plurality of memory portions 201i, i being an integer in the range from 1 to s and s being an integer greater than 1, identical or similar to those of the memory of FIG. 2.

In memory 101 of FIG. 3, the mechanisms of selection of portions 201i, via decoders DECR and DECW and OR gates 203i, the mechanisms of page addressing in portions 201i, via multiplexers 205i, and the mechanisms of input data supply to portions 201i, via write input dW, are identical or similar to those of the memory of FIG. 2, and will not be described again.

Memory 101 of FIG. 3 differs from the memory of FIG. 2 mainly by the circuits used to multiplex the data outputs dout of the different memory portions 201i, towards data output dR of port PTR. In memory 101 of FIG. 3, each portion 201i of the memory has its output dout connected, by a switch S1i, to an output data bus 301 connected to data output dR of the memory. In this example, each switch S1i has a control node connected to input a of OR gate 203i connected to memory portion 201i. When a memory portion 201i is activated in read mode by decoder DECR, data output dout of memory portion 201i is connected to data output dR of the memory by the turning-on of switch S1i.

Thus, in memory 101 of FIG. 3, multiplexer MUX of FIG. 2 is replaced with a distributed multiplexing circuit, distributed at the level of the different memory portions 201i. Switches S1i are for example formed by MOS transistors. Each switch S1i is for example arranged in the vicinity of the memory portion 201i of same rank. Further, output data bus 301 preferably runs close to the different memory portions 201i.

An advantage of the alternative embodiment of FIG. 3 is that it enables, as compared with the example of FIG. 2, to decrease the number of wires or tracks connecting outputs dout of the different memory portions 201i to data output dR of the memory (and thus to decrease the memory surface area and cost).

Specific embodiments have been described. Various alterations, modifications, and improvements will readily occur to those skilled in the art.

In particular, the described embodiments are not limited to the specific examples described in relation with FIGS. 2 and 3 of memories allowing simultaneous accesses in read and write mode to different memory pages. The described embodiments are compatible, in particular, with a dual-port memory allowing simultaneous accesses in read and write mode to any two pages of the memory (which corresponds to the case where each memory segment comprises a single page). In this case, the forming of system 100 of FIG. 1 is simplified, particularly due to the fact that buffer memory 105 of FIG. 1 may be reduced to a register of a single line L1. In this case, the segment address field AS of line L1 may contain the entire page address of the user request.

Further, the above-described embodiments are not limited to the examples of means and mechanisms described in relation with FIG. 1 to manage consecutive user accesses to a same memory segment Si.

The invention claimed is:
1. A system comprising:
 a first memory comprising a plurality of portions of a plurality of pages each, the memory comprising first and second ports providing simultaneous access, respectively in read and in write mode, to two pages of the memory, provided for these pages to belong to different portions of the memory, each portion of the first memory comprising a single port of access to the pages of the portion, this port being capable of being connected to one or the other of the first and second ports of the first memory by multiplexing circuits;
 a control circuit capable of carrying out write operations in pages of the memory, each write operation in a page of the memory comprising a step of reading old data contained in this page, followed by a step of writing new data into this page via the second port while taking into account the old data; and
 a second memory comprising a number of lines equal to the number of pages of a portion of the first memory, and such that each line of the second memory corresponds to an address of a page in the first memory, each line of the second memory containing a first field, a second field, a third field, and a fourth field,
 wherein the control circuit is capable to store in the first field an address of a portion of the first memory, to store in the second field data read from the corresponding page of the portion whose address is stored in the first field, to store in the third field data to be written in the corresponding page of the portion whose address is stored in the first field, and to store in the fourth field a validity bit,
 and wherein the control circuit is capable, for each write operation in a page of the first memory, of consulting the fourth field of the line having its address in the second memory corresponding to the address of the targeted page in the portion to which it belongs, and, when this fourth field is in an invalid state, to read and old data contained in the targeted page and write this data in the second field of the line, to write a new data in the third field of the line, to write the address of the portion containing the targeted page in the first field of the line, and to set the fourth field of the line to a valid state.

2. The system of claim 1, wherein the control circuit is further capable, for each read or write operation in a page of the first memory, of:
   determining whether the fourth field of the address line corresponding to the address of the targeted page is in a valid state; and/or
   comparing the content of the first field of said line with the address of the portion containing the targeted page.

3. The system of claim 1, wherein the first memory is a resistive memory.

4. The system of claim 1, wherein, to perform first and second consecutive write operations in first and second pages of different portions of the first memory, the control circuit is capable of, successively:
   reading first old data from the first page via the first port and writing these data into the second memory;
   reading second old data from the second page via the first port and writing these data into the second memory and, simultaneously, writing first new data into the first page via the second port while taking into account the first old data; and
   writing second new data into the second page via the second port while taking into account the second old data.

5. The system of claim 1, wherein the second memory is a SRAM.

6. The system of claim 1, wherein each page of the first memory comprises a plurality of elementary data storage cells, and wherein the control circuit is capable, for each operation of writing new data into a page of the first memory, during the writing step of this write operation, of comparing the old data read from the page with the new data, and of only writing into the cells of the page having a content to be modified in order to record the new data.

7. The system of claim 1, wherein each page of the first memory comprises at least first and second words, each comprising one or a plurality of elementary data storage cells, and an assembly of one or a plurality of elementary data storage cells capable of containing an error connection code protecting data contained in the first and second words.

8. The system of claim 7, wherein the control circuit is capable, for each operation of writing into a page of the memory, of reading from the page old data comprising the contents of the first and second words of the page and the error correction code protecting them, of correcting if necessary the contents of the first and second words by means of the error correction code, of replacing in the old data the content of at least one of the first and second words with the new user data, of recalculating the error correction code to take into account the new user data, and then of writing into the page the new data and the new error correction code.

* * * * *